United States Patent [19]
Chiba et al.

[11] Patent Number: 5,323,063
[45] Date of Patent: Jun. 21, 1994

[54] BUFFER CIRCUIT

[75] Inventors: Kazuki Chiba, Tokyo; Minoru Koyanagi, Niigata, both of Japan

[73] Assignee: NEC Corporation, Tokyo, Japan

[21] Appl. No.: 827,433

[22] Filed: Jan. 29, 1992

[30] Foreign Application Priority Data

Jan. 30, 1991 [JP] Japan .................... 3-29547

[51] Int. Cl.$^5$ .................. H03K 17/56; H03K 5/01; H03K 3/26
[52] U.S. Cl. .................. 307/246; 307/268; 307/279
[58] Field of Search ............ 307/351, 273, 268, 279, 307/270, 228, 246, 353, 223, 261

[56] References Cited

U.S. PATENT DOCUMENTS

| | | | |
|---|---|---|---|
| 3,619,649 | 5/1969 | Hoffman | 307/228 |
| 4,023,122 | 5/1977 | Oura | 307/261 |
| 4,053,799 | 10/1977 | Minami | 307/351 |
| 4,068,136 | 1/1978 | Minami | 307/246 |
| 4,225,825 | 9/1980 | Watts | 307/228 |
| 4,570,091 | 2/1986 | Yasuda et al. | 307/246 |
| 4,866,301 | 9/1989 | Smith | 307/494 |

Primary Examiner—Curtis Kuntz
Assistant Examiner—Sinh Tran
Attorney, Agent, or Firm—Sughrue, Mion, Zinn, Macpeak & Seas

[57] ABSTRACT

An n-channel open drain or a p-channel open drain buffer circuit is disclosed. When the input to the buffer circuit changes to a disable state, the circuit once drives the output to the other potential level and then switches the output to a high impedance state. The buffer circuit reduces the period of time necessary for the output thereof to rise (in the case of an n-channel open drain scheme) or to fall (in the case of a p-channel open drain scheme) while making most of the advantages of an open drain configuration.

2 Claims, 3 Drawing Sheets

BUFFER CIRCUIT

BACKGROUND OF THE INVENTION

The present invention relates to a buffer circuit and, more particularly, to an n-channel open drain or a p-channel open drain buffer circuit.

An open drain buffer circuit of the type described is extensively used today. A conventional n-channel open drain buffer circuit is implemented as an n-channel MOS transistor having a gate electrode connected to an input terminal, a drain electrode connected to an output terminal, and a source electrode connected to ground. On the other hand, a conventional p-channel open drain buffer circuit is constituted by a p-channel MOS transistor having a gate electrode connected to an input terminal, a drain electrode connected to an output terminal, and a source electrode connected to a power source. Such conventional open drain buffer circuits have problems left unsolved, as follows. Assume that a single signal line is shared by a plurality of devices on a time division basis, and that the devices are implemented by the conventional open drain buffer circuits. Then, the n-channel open drain buffer circuit would slow down the rise of the signal while the p-channel drain buffer circuit would slow down the fall of the signal.

SUMMARY OF THE INVENTION

It is, therefore, an object of the present invention to provide a buffer circuit capable of reducing the period of time necessary for the output to rise or to fall while making the most of the advantages of an open drain scheme.

A buffer circuit of the present invention comprises a MOS transistor, a parasitic capacitance, a charging device for charging, in response to a change of the level of a drive input applied to the gate electrode of the transistor for turning off the transistor, the parasitic capacitance means by the output of the transistor appearing on the drain electrode, and a holding device for holding the charging device in an OFF state when a voltage charged in the parasitic capacitance reaches a predetermined level.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
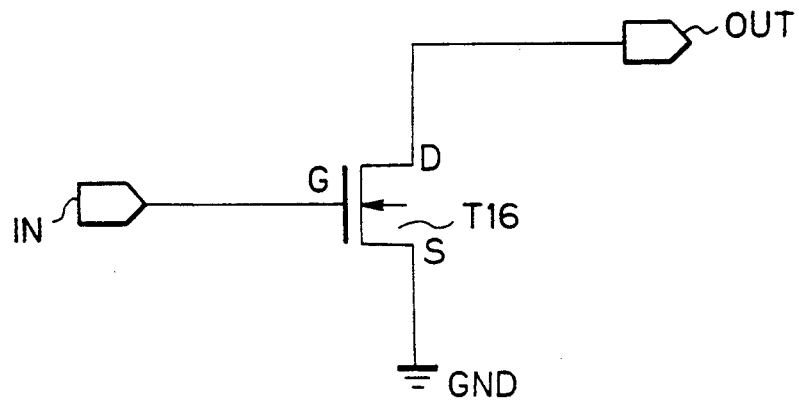
FIGS. 1 and 2 are circuit diagrams showing a conventional n-channel open drain buffer and a conventional p-channel open drain buffer, respectively.

To better understand the present invention, a brief reference will be made to conventional open drain buffer circuits, shown in FIGS. 1 and 2. As shown in FIG. 1, a conventional n-channel open drain buffer circuit is constituted by an n-channel MOS transistor T16 having a gate electrode G connected to an input terminal IN, a source electrode S connected to ground, and a drain electrode D connected only to an output terminal OUT. When a high level voltage is applied to the input terminal IN, the MOS transistor T16 is turned on with the result that the voltage on the output terminal OUT goes low. Conversely, when a low level voltage is applied to the input terminal IN, the transistor T16 is turned off to set up a high impedance state on the output terminal OUT.

Figure 2:
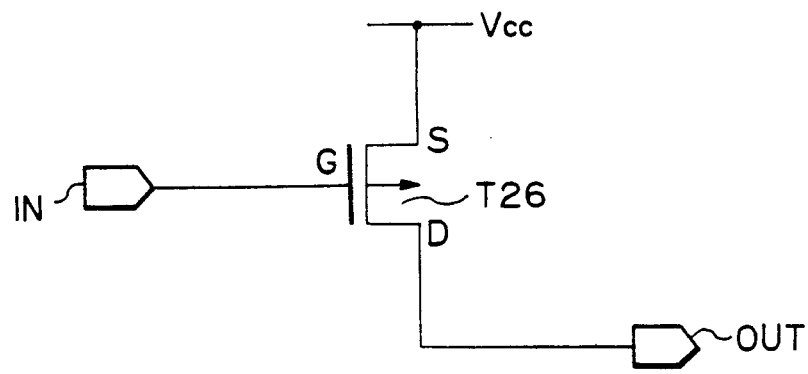

FIG. 2 shows a conventional p-channel drain buffer circuit implemented by a p-channel MOS transistor T26. As shown, the transistor T26 has a gate electrode G connected to an input terminal IN, a source terminal S connected to a power source Vcc, and a drain terminal D connected only to an output terminal OUT. When a low level voltage is applied to the input terminal IN, the transistor T26 is rendered conductive with the result that the voltage on the output terminal OUT goes high. On the arrival of a high level voltage at the input terminal IN, the transistor T26 is rendered non-conductive to set up a high impedance state on the output terminal OUT.

Assume an arrangement wherein a single signal line is shared by a plurality of devices on a time division basis, and that the devices are implemented by the any of the conventional open drain buffer circuits. Then, the n-channel open drain buffer circuit would delay the rise of the signal while the p-channel drain buffer circuit would delay the fall of the signal, as discussed earlier.

Figure 3:
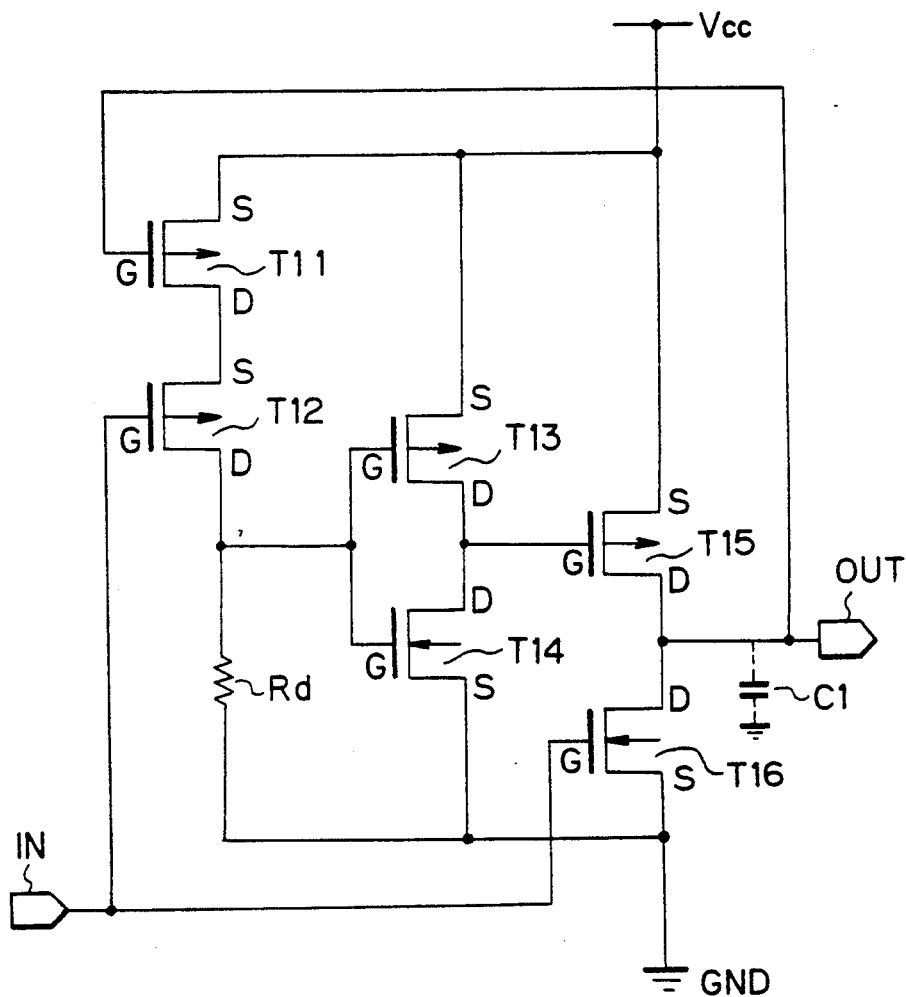
FIG. 3 is a circuit diagram showing a buffer circuit embodying the present invention.

Referring to FIG. 3, a buffer circuit embodying the present invention is shown. In FIG. 3, the same components as the components shown in FIG. 1 are designated by the same reference numerals, and redundant description will be avoided for simplicity. As shown, the buffer circuit is made up of four p-channel CMOS transistors T11–T13 and T15, and two n-channel CMOS transistors T14 and T16. The transistor T11 has a source electrode S connected to a power source Vcc, and a drain electrode D connected to the source electrode S of the transistor T12. The drain electrode D of the transistor T12 is connected to the gate electrode G of the transistor T13 and the gate electrode G of the transistor T14, while being connected to ground via a pull-down resistor Rd. The source electrode S of the transistor T13 is connected to the power source Vcc while the source of the transistor T14 is connected to ground. The transistors T13 and T14 constitute an inverter in combination. The drain electrodes D of the transistors T13 and T14 are connected to the gate electrode G of the transistor T15. The transistor T15 has the source electrode S thereof connected to the power source Vcc and the drain electrode D connected to an output terminal OUT and the gate electrode G of the transistor T11. Likewise, the drain electrode of the transistor T16 is connected to the output terminal OUT and the gate electrode G of the transistor 11. Further, the transistor T16 has the source electrode S thereof connected to ground and the gate electrode G connected to the gate electrode G of the transistor T12 and the input terminal IN. Labeled C1 is a parasitic capacitance.

Figure 4:
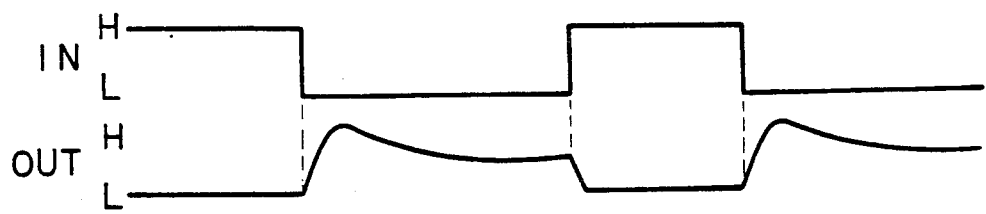
FIG. 4 shows waveforms representative of a specific operation of the embodiment.

The operation of the illustrative embodiment will be described with reference to FIG. 4. On the change of the voltage on the input terminal IN from a low level to a high level, the transistor T12 is turned off while the input to the inverter made up of the transistors T13 and T14 goes low due to the pull-down resistor Rd. Then, the inverter inverts the output thereof to a high level. As a result, the transistor T15 is rendered non-conductive. However, due to the high level voltage on the input terminal IN, the transistor T16 is turned on to discharge the parasitic capacitance C1. Consequently, the voltage on the output terminal OUT goes low, turning on the transistor 11. Conversely, when a low level voltage is applied to the input terminal IN, the transistor T16 is turned off with the result that a high impedance state occurs on the output terminal OUT. Since the transistor T12 is turned on, the input to the inverter constituted by the transistors T13 and T14 goes high with the result that the inverter outputs a low level. Consequently, the transistor T15 is turned on to charge the parasitic capacitance C1, thereby causing the output terminal OUT to go high. As the output terminal OUT goes high due to the charge of the parasitic capacitance C1, the transistor T11 is turned off while the input to the inverter again goes low due to the pull-down resistor Rd. Hence, the output of the inverter goes high. Then, the transistor T15 is turned off after the charging of the parasitic capacitance C1. In this condition, the output terminal OUT is held in the high impedance state and stabilized.

As stated above, on the change of the input from a high level to a low level, the embodiment once drives the output to the high level side to charge the parasitic capacitance and then sets up a high impedance state. This is successful in reducing the period of time necessary for the output to rise. By contrast, the conventional n-channel open drain buffer circuit causes the output to go high by a pull-up resistor and, therefore, delays the rise of the output.

Figure 5:
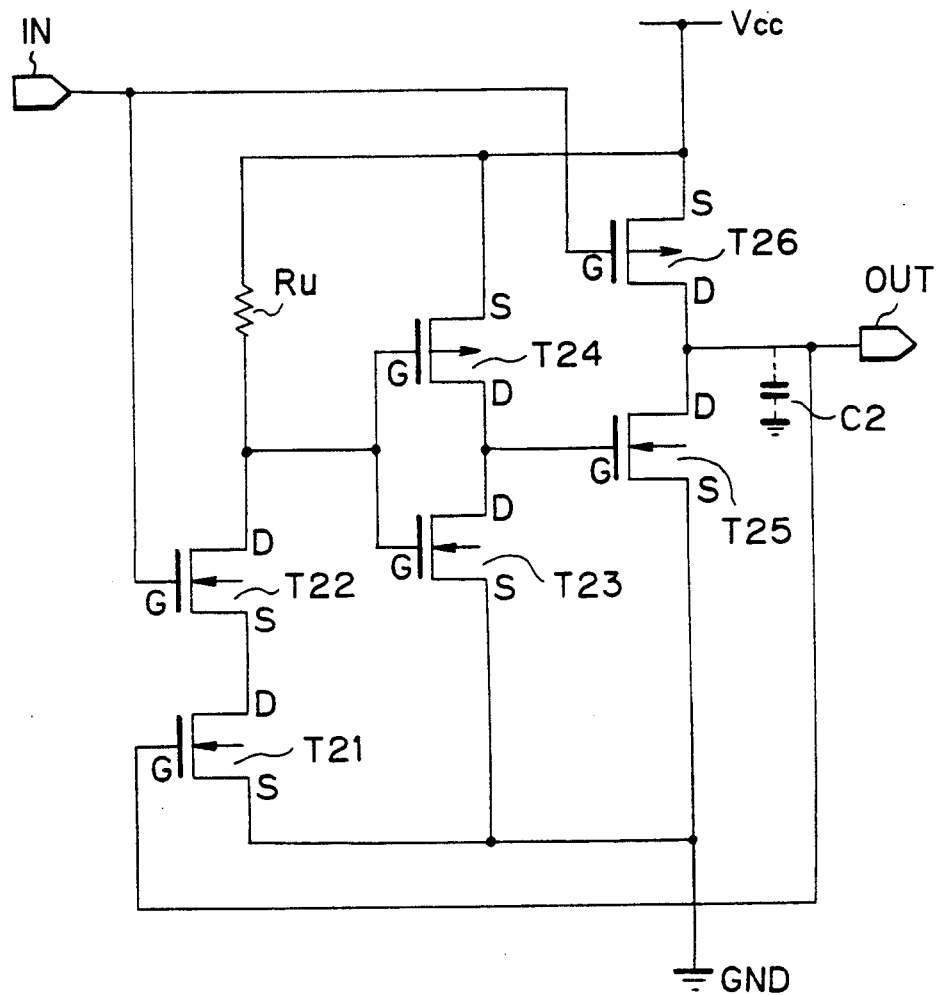
FIG. 5 is a circuit diagram showing an alternative embodiment of the present invention.

FIG. 5 shows an alternative embodiment of the present invention. In FIG. 5, the same or similar components as the components shown in FIG. 2 are designated by the same reference numerals. As shown, the buffer circuit has four n-channel CMOS transistors T21-T23 and T25 and two p-channel CMOS transistors T24 and T26. The transistor T21 has the source electrode thereof connected to ground and the drain electrode D connected to the source electrode S of the transistor T22. The transistor T22 has the drain electrode D thereof connected to the gate electrodes G of the transistors T23 and T24 and connected to a power source Vcc via a pull-up resistor Ru. The source electrode S of the transistor T23 is connected to ground while the source electrode S of the transistor T24 is connected to the power source Vcc. These transistors T23 and T24 constitute an inverter. Both the drain electrode D of the transistor T23 and the drain electrode D of the transistor T24 are connected to the gate electrode G of the transistor T25. The transistor T25 has the source electrode S thereof connected to ground and the drain electrode D connected to an output terminal OUT and the gate of the transistor T21. Likewise, the drain electrode D of the transistor T26 is connected to the output terminal OUT and the gate electrode G of the transistor T21. Further, the transistor T26 has the source electrode S connected to the power source Vcc and the gate electrode G connected to the gate electrode G of the transistor T22 and the input terminal IN. Labeled C2 is a parasitic capacitance.

Figure 6:
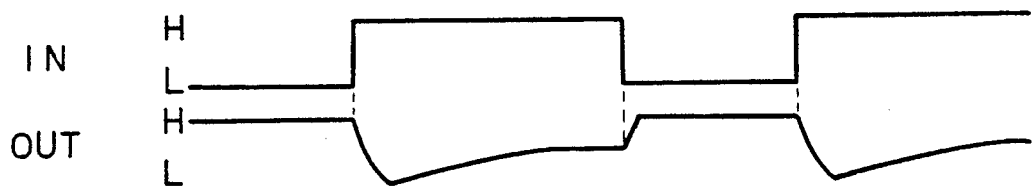
FIG. 6 shows waveforms showing a specific operation of the embodiment shown in FIG. 5.

The operation of this embodiment will be described with reference to FIG. 6. On the change of the voltage on the input terminal IN from a high level to a low level, the transistor T22 is turned off. The input to the inverter constituted by the transistors T23 and T24 goes high due to the pull-up resistor Ru and outputs a low level. As a result, the transistor T25 is rendered non-conductive. However, since the voltage on the input terminal IN is in a low level, the transistor T26 is turned on to charge the parasitic capacitance C2. As a result, the output terminal OUT goes high, turning on the transistor 21. Conversely, when a high level voltage is applied to the input terminal IN, the transistor T26 is turned off, and the output terminal OUT is brought to a high impedance state. Since the transistor T22 is also turned on, the input to the inverter constituted by the transistors T23 and T24 goes low with the result that the inverter produces a high level output. Hence, the transistor T25 is turned on to discharge the parasitic capacitance C2, whereby the output terminal OUT goes low. As the output terminal OUT goes low, the transistor T21 is turned off with the result that the input to the inverter made up of the transistors T23 and T24 again goes high due to the pull-up resistor Ru. Then, the output of the inverter goes low. Consequently, after the parasitic capacitance C2 has been charged, the transistor T25 is turned off, maintaining the output terminal OUT in the high impedance state and stabilizing it.

As stated above, on the transition of the input from a high level to a low level, the embodiment once drives the output to the low level side to discharge the parasitic capacitance C2 and then sets up a high impedance state. The embodiment, therefore, reduces the period of time necessary for the output to fall. The conventional p-channel open drain buffer circuit delays the fall of the output since it uses a pull-down resistor in causing the output to go low.

It is noteworthy that the illustrative embodiments described above are implemented only with CMOS transistors and, therefore, consume a minimum of power. Any of the buffer circuits shown and described may be accommodated in a library as a function block to implement master slice type LSI design.

In summary, it will be seen that the present invention provides a buffer circuit which reduces the period of time necessary for the output thereof to rise (in the case of an n-channel open drain scheme) or to fall (in the case of a p-channel open drain scheme) while making most of the advantages of an open drain scheme. This unprecedented advantage is derived from the fact that when the input to the buffer circuit changes to a disable state, the circuit once drives the output to the opposite potential level and then switches the output to a high impedance state.

Various modifications will become possible for those skilled in the art after receiving the teachings of the present disclosure without departing from the scope thereof.

What is claimed is:

1. A buffer circuit comprising:
  a p-channel first transistor, a p-channel second transistor having a gate thereof connected to an input terminal, and a resistor, said first and second transistors and said resistor being serially connected between a first and a second power source terminals;
  a p-channel third transistor and an n-channel fourth transistor serially connected between said first and second power source terminals, and each having a gate thereof connected to a junction of said second transistor and said resistor; and
  a p-channel fifth transistor having a gate thereof connected to a junction of said third and fourth transistors, and an n-channel sixth transistor having a gate thereof connected to said input terminal, said fifth and sixth transistors being serially connected between said first and second power source terminals;

said fifth and sixth transistors having a junction thereof used as an output terminal and connected to said gate of said first transistor.

2. A buffer circuit comprising:

an n-channel first transistor, an n-channel second transistor having a gate thereof connected to an input terminal, and a resistor, said first and second transistors and said resistor being serially connected between a first and a second power source terminals;

an n-channel third transistor and a p-channel fourth transistor serially connected between said first and second power source terminals, and each having a gate thereof connected to a junction of said second transistor and said resistor; and an n-channel fifth transistor having a gate thereof connected to a junction of said third and fourth transistors, and a p-channel sixth transistor having a gate thereof connected to said input terminal, said fifth and sixth transistors being serially connected between said first and second power source terminals;

said fifth and sixth transistors having a junction thereof used as an output terminal and connected to said gate of said first transistor.

* * * * *